United States Patent [19]
Maiti et al.

[11] Patent Number: 5,885,870
[45] Date of Patent: Mar. 23, 1999

[54] METHOD FOR FORMING A SEMICONDUCTOR DEVICE HAVING A NITRIDED OXIDE DIELECTRIC LAYER

[75] Inventors: Bikas Maiti; Philip J. Tobin; Sergio A. Ajuria, all of Austin, Tex.

[73] Assignee: Motorola, Inc., Schaumburg, Ill.

[21] Appl. No.: 886,927

[22] Filed: Jul. 2, 1997

Related U.S. Application Data

[63] Continuation of Ser. No. 552,451, Nov. 3, 1995, abandoned.
[51] Int. Cl.$^6$ .................................................. H01L 21/318
[52] U.S. Cl. ......................... 438/261; 438/770; 438/591
[58] Field of Search .................................... 438/765, 769, 438/770, 775, 787, 791, 257, 261, 264; D48/DIG. 43, DIG. 156, DIG. 118

[56] References Cited

U.S. PATENT DOCUMENTS

| | | | |
|---|---|---|---|
| 4,584,205 | 4/1986 | Chen et al. | 427/93 |
| 4,894,353 | 1/1990 | Ibok | 437/239 |
| 5,057,463 | 10/1991 | Bryant et al. | 437/238 |
| 5,198,392 | 3/1993 | Fukuda et al. | 437/241 |
| 5,219,773 | 6/1993 | Dunn | 437/42 |
| 5,244,843 | 9/1993 | Chau et al. | 437/239 |
| 5,254,506 | 10/1993 | Hori | 437/239 |
| 5,360,769 | 11/1994 | Thakur et al. | 437/42 |
| 5,376,593 | 12/1994 | Sandhu et al. | 437/242 |
| 5,393,683 | 2/1995 | Mathews et al. | 437/42 |
| 5,397,720 | 3/1995 | Kwong et al. | 437/239 |
| 5,407,807 | 4/1995 | Okada et al. | 437/241 |
| 5,464,783 | 11/1995 | Kim et al. | 437/42 |
| 5,470,611 | 11/1995 | Yang et al. | 427/255.4 |
| 5,478,765 | 12/1995 | Kwong et al. | 437/242 |
| 5,504,021 | 4/1996 | Hong et al. | 437/42 |
| 5,521,127 | 5/1996 | Hori | 437/239 |

FOREIGN PATENT DOCUMENTS

| | | | |
|---|---|---|---|
| 92-226788 | 12/1988 | European Pat. Off. | 437/239 |
| 3-25728 | 11/1991 | Japan | 437/239 |
| 5-198573 | 8/1993 | Japan | 437/239 |
| 6-104252 | 4/1994 | Japan | 437/239 |

OTHER PUBLICATIONS

Anjan Bhattacharyya et al., "A Two–Step Oxidation Process to Improve the Electrical Breakdown Properties of Thin Oxides", pub. Aug. '85 by Journal of the Electrochemical Society Solid–State Science and Technology, pp. 1900–1903.

T. Arakawa et al., "Relationship between Nitrogen Profile and Reliability of Heavily Oxynitrided Tunnel Oxide Films for Flash EEPROMS", published in 1994 at the International Conference on Solid State Devices and Materials Yokohama, pp. 853–855.

J.Ahn et al., "Furnace Nitridation of Thermal SiO2 in Pure N2O Ambient for ULSI MOS Applications", published Feb. 1992 in IEEE Electron Device Letters, vol. 13, No. 2, pp. 117–119.

(List continued on next page.)

Primary Examiner—John F. Niebling
Assistant Examiner—S. Mulpuri
Attorney, Agent, or Firm—Kent J. Cooper

[57] ABSTRACT

In one embodiment a non-volatile memory device having improved reliability is formed by oxidizing a first portion of a semiconductor substrate (12) to form a first silicon dioxide layer (14). The first silicon dioxide layer (14) is then annealed and second portion of the silicon substrate, underlying the annealed silicon dioxide layer (16), is then oxidized to form a second silicon dioxide layer (18). The annealed silicon dioxide layer (16) and the second silicon dioxide layer (18) form a pre-oxide layer (20). The pre-oxide layer (20) is then nitrided to form a nitrided oxide dielectric layer (22). A floating gate is then formed overlying the nitrided oxide dielectric layer (22), which serves as the tunnel oxide for the device. Tunnel oxides formed with the inventive process are less susceptible to stress-induced leakage, and therefore, devices with improved data retention and endurance may be fabricated.

16 Claims, 1 Drawing Sheet

OTHER PUBLICATIONS

Umesh Sharma et al., "Vertically Scaled, High Reliability EEPROM Devices with Ultra–thin Oxynitride Films Prepared by RTP in N2O/O2 Ambient", 1992, IEEE, pp. 17.5.1–17.5.4.

Yeong–Seuk Kim et al., Low–Defect–Density and High–Reliability FETMOS EEPROM's . . . , IEEE Electron Device Letters, vol. 14, No. 7, Jul. 3, pp. 342–344.

H. Fukuda, et al., "Novel N2 O–Oxynitridation Technology for Forming Highly Reliable EEPROM Tunnel Oxide Films", IEEE Electron Device Letters, vol. 12, No. 11, Nov. 1991, pp. 587–589.

Anonymous Research Disclosure, Nov. 1979, "Under–grown multiple dielectric–layer semiconductor device", Jan., 1993, Derwent Publications Ltd. pp. 62–63.

METHOD FOR FORMING A SEMICONDUCTOR DEVICE HAVING A NITRIDED OXIDE DIELECTRIC LAYER

This application is a continuation of Ser. No. 08/552,451 filed Nov. 3, 1995, now abandoned.

FIELD OF THE INVENTION

This invention relates generally to semiconductor devices, and more specifically to a method for forming a semiconductor device having a nitrided oxide dielectric layer.

BACKGROUND OF THE INVENTION

Highly reliable thin dielectric layers are required for the fabrication of advanced semiconductor devices. This is especially true for the fabrication of advanced non-volatile memory devices, such as EPROMs, EEPROMs, and flash memories. In order to meet speed and density requirements these advanced memory devices require tunnel oxides with thicknesses of less than 120 angstroms. Moreover, the tunnel oxide in these devices must be able to withstand repeated program/erase cycles ($>10^6$) which subject the tunnel oxide to high-field stress (>8 MV/cm). The reliability of these advanced memory devices, however, is degraded when the tunnel oxide is scaled to thicknesses below 120 angstroms. The high-field stress applied to the device's thin tunnel oxide, over repeated program/erase cycles, causes the tunnel oxide to become leaky, and this adversely effects the device's data retention time as well as its endurance (i.e., the number of times the device can be programmed and erased). Thus, the fabrication of advanced non-volatile memories is limited by these reliability issues. Accordingly, a need exists for a highly reliable thin dielectric layer that can be used to fabricate advanced semiconductor devices, such advanced non-volatile memory devices.

DETAILED DESCRIPTION OF A PREFERRED EMBODIMENT

Figure 1:
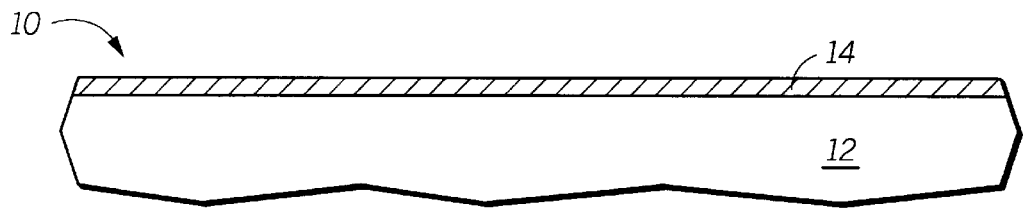
FIGS. 1–5 illustrate, in cross-section, process steps in accordance with one embodiment of the invention.

FIGS. 1 through 5 illustrate, in cross-section, process steps in accordance with one embodiment of the invention wherein a semiconductor device having a nitrided oxide dielectric layer is formed. Shown in FIG. 1 is a portion 10 of an integrated circuit structure comprising a semiconductor substrate 12 and a first layer of silicon dioxide 14. Semiconductor substrate 12 is preferably a monocrystalline silicon substrate. Alternatively, semiconductor substrate 12 may also be a silicon on insulator substrate, a silicon on sapphire substrate, or the like. A first portion of semiconductor substrate 12 is thermally oxidized to form first silicon dioxide layer 14. The first portion of semiconductor substrate 12 is preferably oxidized at a temperature ranging from about 800 degrees centigrade to about 1000 degrees centigrade in an ambient comprising dry oxygen. In one embodiment, the first portion of semiconductor substrate 12 is oxidized in an oxidation ambient comprising dry oxygen (flow rate=0.85 slm), hydrogen chloride (flow rate=0.06 slm), and argon (flow rate=11.4 slm) at a temperature of approximately 950 degrees centigrade for approximately 6 minutes, and results in first silicon dioxide layer 14 having a thickness of approximately 35 angstroms.

Figure 2:
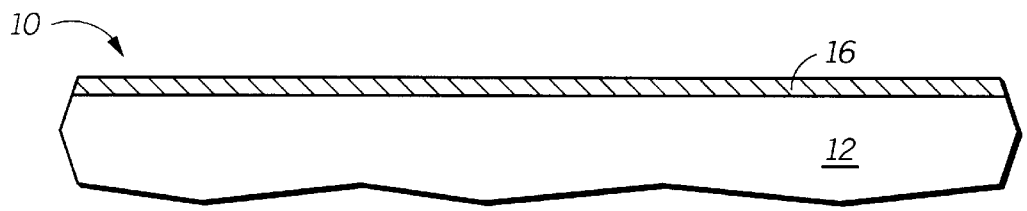

In FIG. 2, first silicon dioxide layer 14 is then annealed in a non-oxidizing ambient to form an annealed silicon dioxide layer 16. First silicon dioxide layer 14 is preferably annealed at a temperature ranging from about 1000 degrees centigrade to about 1100 degrees centigrade. In one embodiment, first silicon dioxide layer 14 is annealed at approximately 1050 degrees centigrade in an argon ambient (flow rate=15 slm) for approximately 15 minutes. Alternatively, first silicon dioxide layer 14 may also be annealed in nitrogen. This anneal densifies and relieves stress in first silicon dioxide layer 14.

Figure 3:
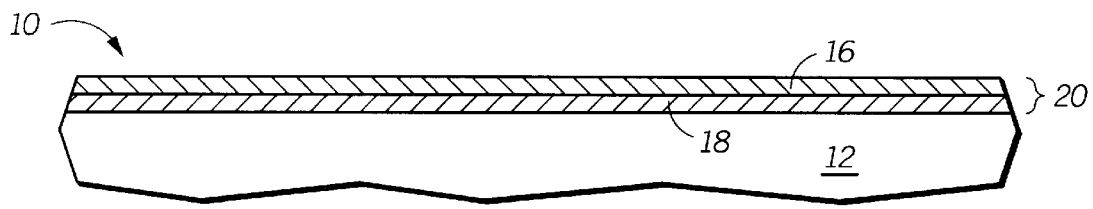

In FIG. 3, a second portion of semiconductor substrate 12 that underlies annealed silicon dioxide layer 16 is oxidized to form a second silicon dioxide layer 18, wherein annealed silicon dioxide layer 16 and second silicon dioxide layer 18 form a pre-oxide layer 20. The second portion of semiconductor substrate 12 is preferably oxidized at a temperature ranging from about 800 degrees centigrade to about 1000 degrees centigrade in an ambient comprising dry oxygen. In one embodiment, the second portion of semiconductor substrate 12 is oxidized in an oxidation ambient comprising dry oxygen (flow rate=0.85 slm), hydrogen chloride (flow rate=0.06 slm), and argon (flow rate=11.4 slm) at a temperature of approximately 950 degrees centigrade for approximately 5 minutes, and results in second silicon dioxide layer 18 having a thickness of approximately 30 angstroms, and thus, pre-oxide layer 20 has a thickness of approximately 65 angstroms. Additionally, in one embodiment, pre-oxide layer 20 is then subsequently annealed in a non-oxidizing ambient comprising argon (flow rate=15 slm) at a temperature of approximately 950 degrees centigrade for approximately one hour. Alternatively, pre-oxide layer 20 may also be annealed in nitrogen.

Figure 4:
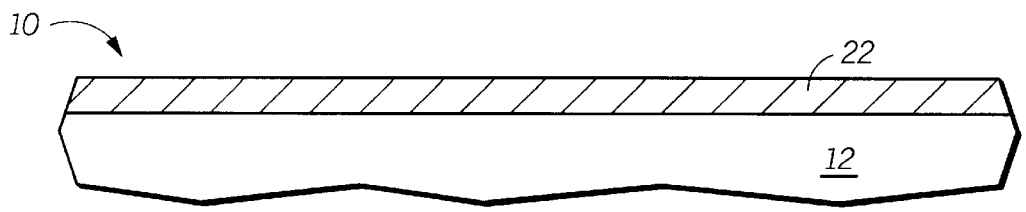

In FIG. 4, pre-oxide layer 20 is then nitrided to form a nitrided oxide dielectric layer 22. Pre-oxide layer 20 may have a thickness of up to 170 angstroms and is preferably nitrided using an ambient comprising nitrous oxide ($N_2O$) at a temperature ranging from about 800 degrees centigrade to about 1200 degrees centigrade. Alternatively, dielectric layer 20 may be nitrided using an ambient comprising nitric oxide (NO) at a temperature ranging from about 800 degrees centigrade to about 1200 degrees centigrade. In one embodiment, pre-oxide layer 20 is nitrided using $N_2O$ (flow rate=19.95 slm) at a temperature of approximately 950 degrees centigrade for approximately 28 minutes, and results in nitrided oxide dielectric layer 22 having a thickness of approximately 95 angstroms. Additionally, in one embodiment, nitrided oxide dielectric layer 22 is then subsequently annealed in a non-oxidizing ambient comprising nitrogen (flow rate=15 slm) at approximately 950 degrees centigrade for approximately one hour. Alternatively, nitrided oxide dielectric layer 22 may also be annealed in argon.

Figure 5:
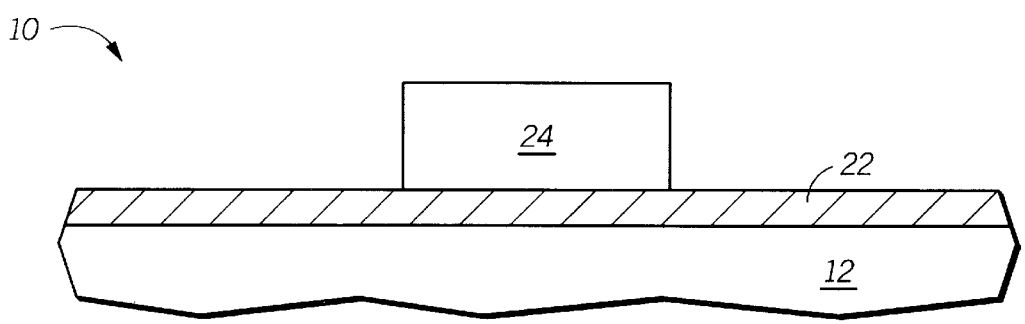

In FIG. 5, a gate electrode 24 is then formed overlying nitrided oxide dielectric layer 22. In a preferred embodiment gate electrode 24 comprises a doped silicon layer, which is formed using conventional deposition, doping, and patterning techniques. Gate electrode 24 may be formed by depositing a silicon layer, such as polysilicon or amorphous silicon, over nitrided oxide layer 24, and then subsequently doping it with conventional diffusion or ion implantation techniques. Alternatively, gate electrode 24 may also be formed by depositing an insitu-doped polysilicon or an insitu-doped amorphous silicon layer over nitrided oxide dielectric layer 22. After gate electrode 24 is formed conventional processing techniques are then used to complete device fabrication. In one embodiment gate electrode 24 is the floating gate and nitrided oxide dielectric layer 22 is the tunnel oxide for a non-volatile device, such as a EPROM, a EEPROM, or a flash memory. Alternatively, in another embodiment gate electrode 24 is the control gate, and nitrided oxide dielectric layer 22 is the gate oxide, for an MOS transistor.

It should be appreciated that pre-oxide layer 20 may be formed in a first process chamber and then nitrided in a second chamber to form nitrided oxide dielectric layer 22. Alternatively, pre-oxide layer 20 and nitrided oxide layer dielectric 22 may be formed in the same process chamber using an insitu-process. For example, in one embodiment nitrided oxide dielectric layer 22 is formed with the following insitu-process. Semiconductor substrate 12 is placed within a process chamber and a first oxidation ambient is introduced into the process chamber to form first silicon dioxide layer 14. A non-oxidizing ambient is then introduced into the process chamber to form annealed silicon dioxide layer 16. A second oxidation ambient is then introduced into the process chamber to form second silicon dioxide layer 18, and to form pre-oxide layer 20. The process chamber is then purged with an non-oxidizing ambient, such as argon, prior to introducing a nitriding ambient into the process chamber. The chamber purge removes residual oxygen in the process chamber left over from the second oxidation step that can adversely effect the thickness uniformity of the resulting nitrided oxide dielectric layer formed across the wafer and from wafer to wafer. It should also be noted that the chamber purge can also be used to anneal pre-oxide layer 20 prior to its nitridation. A nitriding ambient is then introduced into the process chamber to form nitrided oxide dielectric layer 22. After nitrided oxide dielectric layer 22 has been formed, semiconductor substrate 12 is then removed from the process chamber. Gate electrode 24 is then subsequently formed overlying nitrided oxide dielectric layer 22 as described above. Additionally, it should be noted that nitrided oxide dielectric layer 22 may also be annealed in the process chamber, as described above, prior to removing semiconductor 12 from the process chamber. The use of an insitu-process improves process throughput and minimizes process induced defectivity, and may be carried out in the process chamber of a horizontal or vertical diffusion furnace, or in the process chamber of a single wafer diffusion system, such as in a rapid thermal diffusion system.

The foregoing description and illustrations contained herein demonstrate many of the advantages associated with the present invention. Applicants have found that the oxidation process used to form the pre-oxide layer for a nitrided oxide dielectric layer affects the reliability of the resulting nitrided oxide dielectric layer. More specifically, Applicants have found that if the pre-oxide layer is formed with two oxidation steps, and an intervening anneal step, then the reliability of the resulting nitrided oxide dielectric layer is improved over other nitrided oxide dielectric layers, that are formed with different pre-oxide oxidation processes. The reasons for this improvement are not fully understood, but nitrided oxide dielectric layers formed with Applicants' inventive process have improved charge-to-breakdown ($Q_{bd}$), as compared to various other thermal oxides and other nitrided oxide dielectric layers formed with the same nitridation process, but with a different pre-oxide process. Moreover, Applicants have found that EEPROM devices fabricated with their inventive process have improved program/erase endurance over EEPROM devices that have their tunnel oxides formed with one of these other dielectric layers. Thus, non-volatile memory devices having improved reliability can be fabricated with Applicants inventive process. In addition, Applicants have found that if an insitu-process is used to form a nitrided oxide dielectric layer, then the process chamber must be purged prior to nitriding the pre-oxide layer in order to remove residual oxygen from the process chamber. The presence of residual oxygen adversely effects the thickness uniformity of the resulting nitrided oxide dielectric layer from run to run and from wafer to wafer.

Thus it is apparent that there has been provided, in accordance with the invention, a method for forming a semiconductor device having a nitrided oxide dielectric layer that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific non-volatile memory device. EPROMs, EEPROMs and flash memories may be fabricated using this invention. Moreover, the inventive process is not limited to a specific process chamber or diffusion system. Therefore, it is intended that this invention encompass all such variations and modifications as fall within the scope of the appended claims.

We claim:

1. A method for forming a semiconductor device having a nitrided oxide dielectric layer comprising the steps of:

providing a semiconductor substrate;

placing the semiconductor substrate in a process chamber;

introducing a first oxidation ambient into the process chamber to oxidize a first portion of the semiconductor substrate and to form a first layer of silicon dioxide, wherein the first portion of the semiconductor substrate is oxidized at a first temperature ranging from about 800 degrees centigrade to about 1000 degrees centigrade and the first oxidation ambient comprises dry oxygen, argon, and hydrogen chloride;

introducing argon into the process chamber to anneal the first layer of silicon dioxide and to form an annealed silicon dioxide layer, wherein the first layer of silicon dioxide is annealed at a second temperature ranging from about 1000 degrees centigrade to about 1100 degrees centigrade, and wherein the second temperature is greater than the first temperature;

introducing a second oxidation ambient into the process chamber to oxidize a second portion of the semiconductor substrate underlying the annealed silicon dioxide layer and to form a second layer of silicon dioxide and to form a pre-oxide layer, wherein the pre-oxide layer comprises the second layer of silicon dioxide and the annealed silicon dioxide layer, and wherein the second portion of the semiconductor substrate is oxidized at a third temperature ranging from about 800 degrees centigrade to about 1000 degrees centigrade and the second oxidation ambient comprises dry oxygen, argon, and hydrogen chloride, and wherein the second temperature is greater than the third temperature;

purging the process chamber with argon after the pre-oxide layer has been formed;

introducing a nitriding ambient comprising a gas selected from a group consisting of $N_2O$ and NO into the process chamber and nitriding the pre-oxide layer to form a nitrided oxide dielectric layer, wherein the step of purging the process chamber is performed prior to nitriding the pre-oxide layer;

removing the semiconductor substrate from the process chamber after forming the nitrided oxide dielectric layer; and forming a gate electrode overlying the nitrided oxide dielectric layer.

2. The method of claim 1, wherein the step of introducing the nitriding ambient the pre-oxide layer is nitrided at a temperature ranging from about 800 degrees centigrade to about 1200 degrees centigrade.

3. The method of claim 1, wherein the step of forming the gate electrode comprises the step of depositing a silicon layer.

4. The method of claim 3, wherein the step of forming the gate electrode is further characterized as forming a floating gate.

5. The method of claim 4, wherein the nitrided oxide dielectric layer is further characterized as a tunnel oxide layer.

6. The method of claim 5, wherein the tunnel oxide layer is further characterized as a thinness of less than 170 angstroms.

7. The method of claim 6, further comprising the step of annealing the tunnel oxide layer in a non-oxidizing ambient prior to depositing the silicon layer.

8. The method of claim 7, wherein the step of annealing the tunnel oxide layer is further characterized as annealing the tunnel oxide layer with an ambient comprising nitrogen.

9. The method of claim 1, further comprising the step of annealing the nitrided oxide dielectric layer in a non-oxidizing ambient prior to forming the gate electrode.

10. A method for forming a semiconductor device having a nitrided oxide dielectric layer comprising the steps of:

providing a semiconductor substrate;

oxidizing a first portion of the semiconductor substrate to form a first silicon dioxide layer, wherein the first portion of the semiconductor substrate is oxidized at a first temperature ranging from about 800 degrees centigrade to about 1000 degrees centigrade in an ambient comprising dry oxygen, argon, and hydrogen chloride;

annealing the first silicon dioxide layer in argon to form an annealed silicon dioxide layer, wherein the first silicon dioxide layer is annealed at a second temperature ranging from about 1000 degrees centigrade to about 1100 degrees centigrade, and wherein the second temperature is greater than the first temperature;

oxidizing a second portion of the semiconductor substrate underlying the annealed silicon dioxide layer to form a second silicon dioxide layer and to form a pre-oxide layer, wherein the pre-oxide layer comprises the second silicon dioxide layer and the annealed silicon dioxide layer, wherein the second portion of the semiconductor substrate is oxidized at a third temperature ranging from about 800 degrees centigrade to about 1000 degrees centigrade in an ambient comprising dry oxygen, argon, and hydrogen chloride, and wherein the second temperature is greater than the third temperature;

nitriding the pre-oxide layer with a gas selected from a group consisting of $N_2O$ and NO to form a nitrided oxide dielectric layer; and forming a gate electrode overlying the nitrided oxide dielectric layer.

11. The method of claim 10, wherein the step of forming the gate electrode comprises the step of depositing a silicon layer.

12. The method of claim 11, further comprising the step of annealing the nitrided oxide dielectric layer in an ambient comprising nitrogen prior to depositing the silicon layer.

13. The method of claim 11, wherein the step of forming the gate electrode is further characterized as forming a floating gate.

14. The method of claim 13, wherein the nitrided oxide dielectric layer is further characterized as a tunnel oxide layer.

15. The method of claim 14, further comprising the step of annealing the tunnel oxide layer in a non-oxidizing ambient prior to depositing the silicon layer.

16. The method of claim 15, wherein the step of annealing the tunnel oxide layer is further characterized as annealing the tunnel oxide layer in an ambient comprising nitrogen.

* * * * *